(12) United States Patent
Massoudi

(10) Patent No.: US 6,173,430 B1
(45) Date of Patent: Jan. 9, 2001

(54) DEVICE AND METHOD FOR DETECTING SYNCHRONIZATION PATTERNS IN CD-ROM MEDIA

(75) Inventor: Firooz Massoudi, Santa Clara, CA (US)

(73) Assignee: STMicroelectronics, N.V. (NL)

( * ) Notice: Under 35 U.S.C. 154(b), the term of this patent shall be extended for 0 days.

(21) Appl. No.: 09/023,169

(22) Filed: Feb. 13, 1998

(51) Int. Cl.$^7$ ................................................ H03M 13/00
(52) U.S. Cl. .......................... 714/775; 714/747; 360/51; 375/368
(58) Field of Search .................... 714/775, 746, 714/798, 789; 375/357, 368; 360/51

(56) References Cited

U.S. PATENT DOCUMENTS

| 5,341,387 | * | 8/1994 | Nguyen | 714/788 |
| 5,729,556 | * | 3/1998 | Benbassat et al. | 714/747 |
| 5,852,524 | * | 12/1998 | Glover et al. | 360/51 |
| 5,940,233 | * | 8/1999 | Malone, Sr. | 360/51 |

* cited by examiner

Primary Examiner—Emmanuel L. Moise
Assistant Examiner—Guy Lamarre
(74) Attorney, Agent, or Firm—Theodore E. Galanthay; Lisa K. Jorgenson; Steven H. Slater

(57) ABSTRACT

Disclosed is a peripheral device for reliably detecting synchronization patterns in CD-ROM media. The peripheral device has an internal circuitry for controlling and processing data that is read from a medium of the peripheral device is disclosed. The peripheral device comprises a digital signal processor, a decoder circuit, and a state machine. The digital signal processor is configured to receive the data that is being read from the medium of the peripheral device. The decoder circuit is coupled to the digital signal processor and forms a part of the internal circuitry. Further, the decoder circuit includes an internal RAM that is configured to store a sector of the data including a current sync pattern and a next sync pattern. The state machine resides in the decoder for analyzing the current sync pattern and the next sync pattern of the sector of the data. In the analysis mode, the state code is configured to determine whether a fatal error is present in the data.

27 Claims, 5 Drawing Sheets

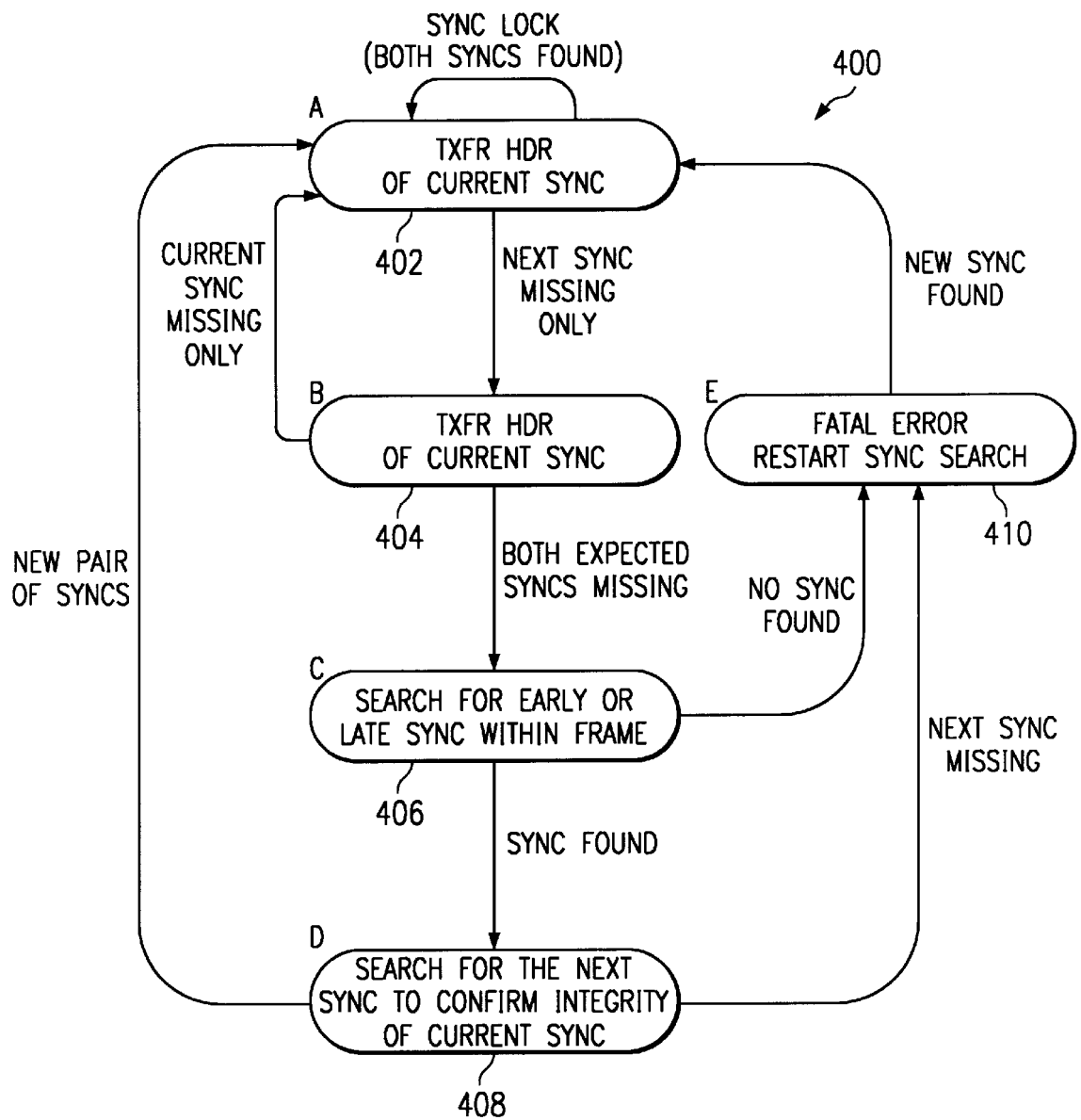

DEVICE AND METHOD FOR DETECTING SYNCHRONIZATION PATTERNS IN CD-ROM MEDIA

BACKGROUND OF THE INVENTION

1. Field of the Invention

This invention relates generally to computer peripheral devices, and more particularly to devices for processing data to detect synchronization patterns from compact disc media.

2. Description of the Related Art

Originally, compact disc read-only memory (CD-ROM) technology gained popularity as an audio technology. By providing superior digital sound quality, CD-ROM drives and discs have effectively displaced phonographs in the music industry. In recent years, CD-ROM technology has also become popular in computer industry as well for recording and reading a large amount of information or data.

Indeed, the CD-ROM drive has been adopted by the computer industry as a standard peripheral device. Prior Art FIG. 1A illustrates a computer system 100 including an external CD-ROM drive 104. The computer system 100 is coupled to the external CD-ROM drive 104 through a cable 106 conforming to standards such as IDE, SCSI, ATAPI, etc. By loading CD-ROM discs into the CD-ROM drive, a user of the computer system can conveniently access volumes of information for education, entertainment, games, music, etc.

Prior Art FIG. 1B illustrates a functional block diagram of a conventional CD-ROM drive peripheral device. An analog interface 110 receives a data stream from a CD-ROM medium (e.g., disc) for interfacing data to a digital signal processor (DSP) 112. The DSP 112 processes and transmits the data stream in serial mode to a CD-ROM decoder 116. An eight-to-fourteen modulation (EFM) decoder 114 also transmits data to the CD-ROM decoder 116.

The CD-ROM decoder 116 includes a synchronization (sync) detector and a header detector. Accordingly, the sync detector evaluates the data stream to detect sync patterns or marks as they are received. The header detector detects headers to determine whether the header contains a desired header that is associated with a desired sector minute-second-frame (MSF) address. In addition, the CD-ROM decoder 116 performs other decoding functions such as error correction code (ECC). Then, only the data from the CD-ROM decoder 116 goes into a host 100 (e.g., computer system) through an interface such as IDE or SCSI interface.

In CD-ROM media (e.g., CD-ROM disc), information or data is typically stored in units of sectors that are laid out in a continuous spiral from the center and extending through to the circumference of the CD-ROM disc. Prior Art FIG. 1C shows the sequential arrangement of exemplary sectors 11, 12, 13, 14, and 15 in a CD-ROM disc. Each sector contains 2,352 bytes including a synchronization (sync) word 122 of twelve bytes. Hence, two consecutive sync words 122 are separated by 2,340 bytes. The twelve bytes in the sync word 122 are generally assigned a sync pattern that include two 0's at the beginning and two 0's at the end of the twelve byte word, with all the remaining bits in between filled with 1's.

In order to access specific information in CD-ROM media, the CD-ROM drive must be able to identify the beginning of a sector. By providing a sync pattern that is exceptional to the rest of the data pattern, the CD-ROM drive can readily recognize the beginning of a sector. Immediately following the sync pattern is a header of four bytes. The header provides the MSF address of the sector. Following the four byte header are 2,048 bytes for storage of data and 288 bytes of auxiliary data for storing error detection code (EDC) and error correction code (ECC). It should be appreciated that the data can be audio data, in which case, the sector does not contain a header or auxiliary data.

Once the beginning of the sector has been identified, the CD-ROM drive can read the header following the sync pattern to determine whether the current sector is the desired sector. If the MSF address in the header of the current sector matches that of the desired sector, then the sector contains the desired data. Otherwise, the CD-ROM drive proceeds to identify the next sync word.

Reading from CD-ROM media typically involves the host issuing a command specifying the address of sectors to be read. In response, the CD-ROM drive obtains the track number where the sectors can be found from a Table of Contents on the CD-ROM media. Each track has a few thousand sectors. The CD-ROM drive reads data from the beginning of the track, searching specifically for sync patterns to identify the sectors. In this process, whenever a sync mark is detected, the associated header information indicating the MSF address of the sector is retrieved. If the address of the sector matches that of the desired sector, then the target sector has been found and desired data can be read. When the last desired sector has been read, the sync detection and reading processes terminate.

Detecting sync marks, however, has presented several problems in the past. For example, a sync pattern often cannot be detected as a sync mark due to noise, which may cause a 0 in the sync pattern to be read as 1 or vice versa. In addition, physical elements such as fingerprints, dust, etc. can cause an obstruction on CD-ROM media, which may lead to degradation or mis-reading of a sync pattern. When the sync mark associated with a sector cannot be detected in these situations, the reading head of a CD-ROM drive will move back to the beginning of the track again. In the alternative, when one or two sync marks are not detected in the middle of a sequence of several sectors, a sync mark is inserted based on the detected sync marks of other sectors.

Another problem in detecting sync marks involves so called "packet writing" in CD-Recordable (CD-R) media or discs, which is usually written only one time, in one or more sessions, and then can be read like typical CD-ROM discs. Specifically, information in packet writing is recorded in a sequence of sectors while the CD-R disc is rotating. This rotation generates an inherent gap in time between detecting the beginning of a sector and writing on the sector. That is, when the beginning of a sector is detected, the desired writing location on the CD-R disc will usually be passed-up, and therefore the writing location will be late by a number of bytes. Hence, when the sync pattern is written to mark the beginning of the sector, the sync mark is inherently recorded after a gap of a number of bytes. When the disc is read back, the sync mark may not be detected at all because the sync pattern is not at the proper place (i.e., at every 2353 bytes). In addition, the gap created in packet writing wastes disc space.

In the prior art, when a desired sync mark is not detected, the CD-ROM peripheral device typically restarts the search again by repositioning its read head in the original track position. The CD-ROM device then waits for the disc to rotate to the beginning of the track, and then restarts the reading to detect sync marks. Waiting for the entire revolution of the disc thus increases latency and degrades performance.

In view of the foregoing, what is needed is a device and method that can reliably detect sync patterns. What is further needed is a device and method that differentiates a genuine sync pattern from an erroneous one. In addition, what is needed is a device and method that can also detect missing sync pattern with a high degree of reliability.

SUMMARY OF THE INVENTION

Broadly speaking, the present invention fills these needs by providing a device and method for reliably detecting synchronization patterns in CD-ROM media. It should be appreciated that the present invention can be implemented in numerous ways, including as a process, an apparatus, a system, a device, a method, or a computer readable medium. Several inventive embodiments of the present invention are described below.

In one embodiment, a peripheral device having internal circuitry for controlling and processing data that is read from a medium of the peripheral device is disclosed. The peripheral device comprises a digital signal processor, a decoder circuit, and a state machine. The digital signal processor is configured to receive the data that is being read from the medium of the peripheral device. The decoder circuit is coupled to the digital signal processor and forms a part of the internal circuitry. Further, the decoder circuit includes an internal RAM that is configured to store a sector of the data including a current sync pattern and a next sync pattern. The state machine resides in the decoder for analyzing the current sync pattern and the next sync pattern of the sector of the data. In the analysis mode, the state code is configured to determine whether a fatal error is present in the data.

In another embodiment, a method for detecting sync patterns from data that is read from a CD-ROM medium is disclosed. The method includes: a) receiving the data that is being read from the CD-ROM medium; b) storing a sector of the data including a current sync pattern and a next sync pattern; and c) analyzing the current sync pattern and the next sync pattern of the sector of the data to determine whether a fatal error is present in the data. Preferably, the fatal error is present when the current sync pattern and the next sync pattern are not identified and the analyzing determines that a middle sync pattern between the current sync pattern and the next sync pattern is not identified.

In yet another embodiment, a device includes a means for sequentially receiving data that are read from the CD-ROM media for processing. The device further includes a means for storing the sequentially received data in a first-in-first-out (FIFO) buffer. Preferably, the FIFO buffer is large enough to store a current sync pattern, a sector associated with the current sync pattern, and a next sync pattern. In this configuration, the data is stored in the FIFO buffer as received in a first-in and first-out manner such that the next sync pattern becomes a new current sync pattern and a new next sync pattern becomes a new next sync pattern. In addition, the device includes a means for detecting the integrity of the sync patterns in the data stored in the FIFO buffer wherein a fatal error is triggered when no sync pattern is identified in the FIFO buffer.

Advantageously, the present invention can detect an unidentified sync pattern and continue with normal operation without restarting the search from the beginning of a track. For example, the present invention allows detection of the unidentified sync pattern by identifying the presence of the next sync pattern when a sync pattern is not identified due to corruption or noise. The detection of the next sync pattern thus confirms that the previous unidentified sync pattern has been misread due to corruption, noise, etc.

In addition, by using a hard wired state machine to automatically detect and examine sync patterns on-the-fly, the present invention provides significant performance advantages over the prior art, which typically ignored or tolerated unidentified syncs through software. Furthermore, the present invention also significantly improves reading performance in reading CD-R media that are recorded using the packet writing technique. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

Prior Art

Prior Art

Prior Art

FIG. 4 shows a state diagram depicting changes in the states of the sync decoder state machine in accordance with one embodiment of the present invention.

DETAILED DESCRIPTION OF THE PREFERRED EMBODIMENTS

An invention is described for a device and method for detecting synchronization patterns in CD-ROM media. It will be obvious, however, to one skilled in the art, that the present invention may be practiced without some or all of these specific details. In other instances, well known process operations have not been described in detail in order not to unnecessarily obscure the present invention.

Figure 1A:
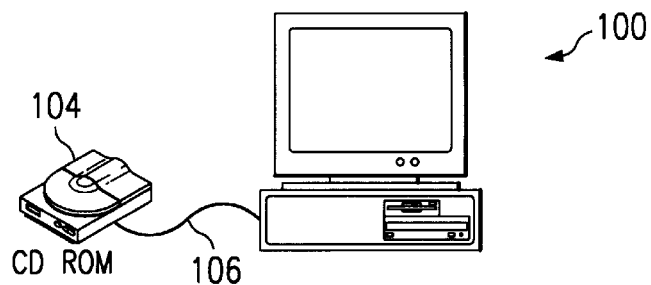
FIG. 1A illustrates a computer system including a CD-ROM drive.
Figure 1B:
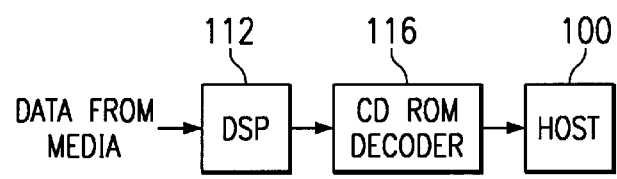
FIG. 1B illustrates a functional block diagram of a conventional CD-ROM drive peripheral device.
Figure 1C:
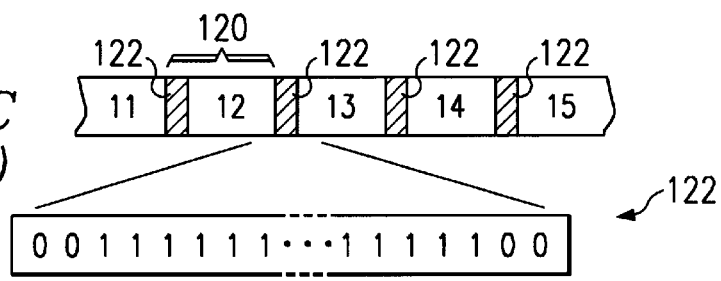
FIG. 1C illustrates the sequential arrangement of a number of exemplary sectors in a CD-ROM disc including sync marks.
Figure 2A:
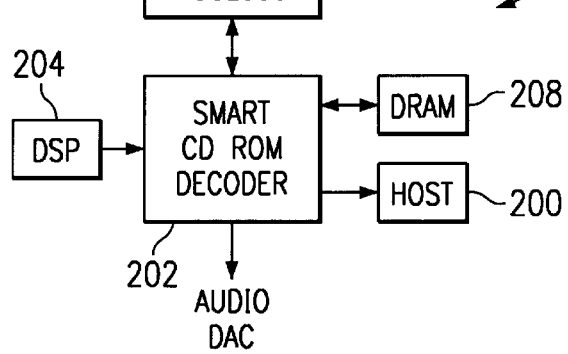
FIG. 2A illustrates a block diagram of a CD-ROM system, which processes data that is being read from a CD-ROM in accordance with one embodiment of the present invention.

FIG. 2A illustrates a block diagram of a CD-ROM system 201, which processes data that is being read from a CD-ROM in accordance with one embodiment of the present invention. Initially, a digital signal processor (DSP) 204 is used to receive data (e.g., a data stream) from a CD-ROM media. The DSP 204 then processes the data and provides the information to a smart CD-ROM decoder 202. The smart CD-ROM decoder 202 preferably includes a state machine that is configured to analyze and process the data that is read from the media in order to determine the integrity of the data, including sync detection, error correction, header search, etc.

The smart CD-ROM decoder 202 is also coupled to a processor 206 to receive a request to read data from the CD-ROM media. Along with the request, the processor 206 also provides the MSF address of the desired data in the CD-ROM media. The smart CD-ROM decoder 202 is also coupled to a dynamic random access memory (DRAM) 208 that is used to store data during the processing by the smart CD-ROM decoder 202 and/or the processor 206.

Once the smart CD-ROM decoder 202 has processed the data to determine data integrity, the processed data is output to a host 200. In general, the host 200 may be any computer that is coupled to a CD-ROM device. The CD-ROM device may be either an external peripheral device or a device that is integrated into the host 200. Also shown is an output that is in communication with an audio digital-to-analog converter. The digital-to-analog converter is used to process audio data that is read by the smart CD-ROM decoder.

Figure 2B:
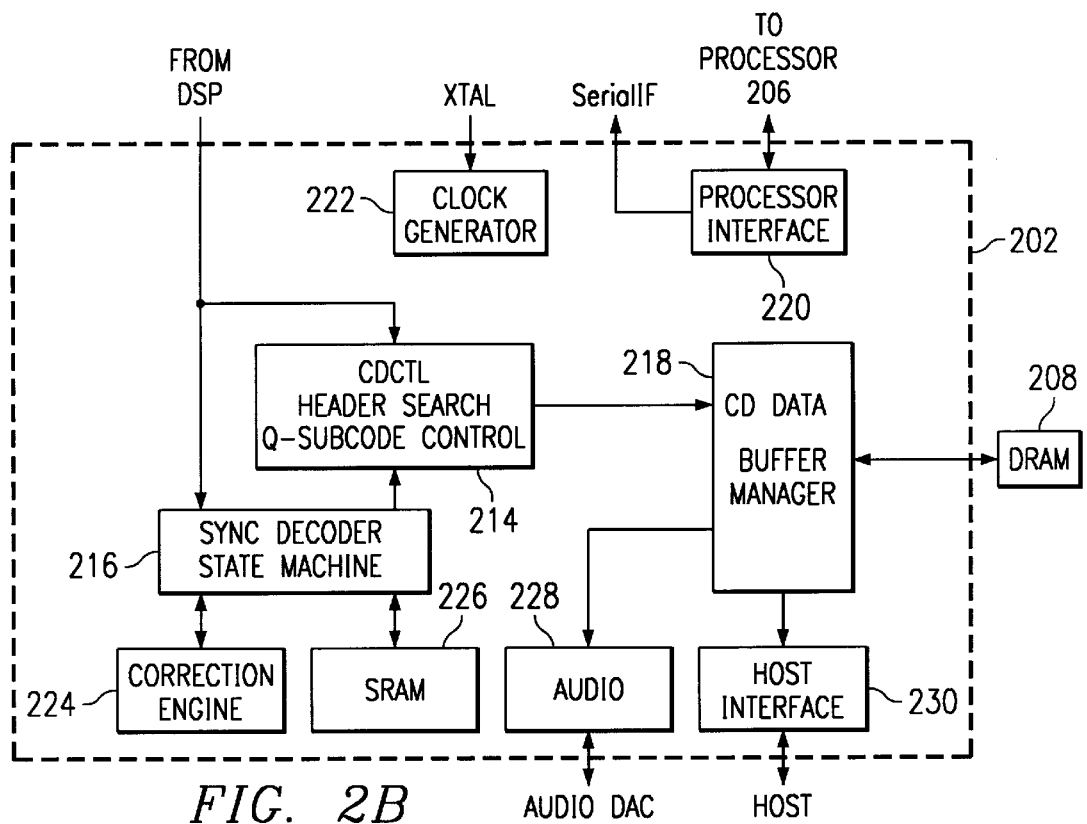
FIG. 2B shows a more detailed diagram of a smart CD-ROM decoder that incorporates a sync decoder state machine for processing sync patterns in accordance with one embodiment of the present invention.

FIG. 2B shows a more detailed diagram of the smart CD-ROM decoder 202 in accordance with one embodiment of the present invention. The smart CD-ROM decoder 202 is coupled to the DSP 204. A sync decoder state machine 216 and a CD controller 214 receive data from the DSP. The CD controller 214 is used to perform header searches and Q subcode control. The CD controller 214 is also in communication with a buffer manager 218 that receives the compact disc data and controls flow of data between the smart CD-ROM decoder 202 and external components such as, the DRAM 208, the host 200, and the audio digital-to-analog converter (DAC).

Within the smart CD-ROM decoder 202, the sync decoder state machine 216 is in communication with the CD-ROM controller 214 as well as a correction engine 224 and a static random access memory (SRAM) 226. The SRAM 226 is used to store data from a CD-ROM media during the processing by the sync decoder state machine 216. In the preferred embodiment, the SRAM 226 is implemented as a first-in-first-out (FIFO) buffer that is large enough to at least store a sector, including its associated current sync pattern, and also a next sync pattern. The size of the SRAM 226 is therefore at least 2,364 bytes, and suitable for storing a sector and the next sync pattern. Preferably, the SRAM 226 is about 6 Kbytes, and is therefore capable of storing other data that is used for error correction, for example.

In the FIFO configuration of the SRAM 226, the data is received and stored in the SRAM 226 in a first-in and first-out manner, such that the next sync pattern becomes a new current sync pattern and a new next sync pattern becomes a new next sync pattern. The FIFO preferably stores the sync patterns exactly as they are arranged in the CD-ROM medium. That is, the FIFO contains a current sync, and the rest of data in the sector associated with the current sync, and the next sync. In this arrangement, the current sync and the next sync are apart from each other by 2352 bytes. This fixed distance between the two syncs is used to facilitate identifying sync patterns. Although the present embodiment utilizes an SRAM to implement the FIFO buffer, it can also employ other memory units such as DRAM, static dynamic random access memory (SDRAM), etc. The functionality of the sync decoder state machine 216 in connection with the SRAM 226 will be described in greater detail below with respect to FIGS. 3–5.

Referring still to FIG. 2B, the buffer manager 218 is also shown in communication with an audio interface 228 which then couples to the audio digital-to-analog converter. The buffer manager is also in communication with a host interface 230 which couples to the host 200 that is external to the smart CD-ROM decoder 202. The smart CD-ROM decoder 202 also includes a clock generator 222 that is coupled to an external crystal (XTAL). The smart CD-ROM decoder 202 also includes a processor interface 220 which couples to the processor 206 and a serial interface (IF).

Figure 3:
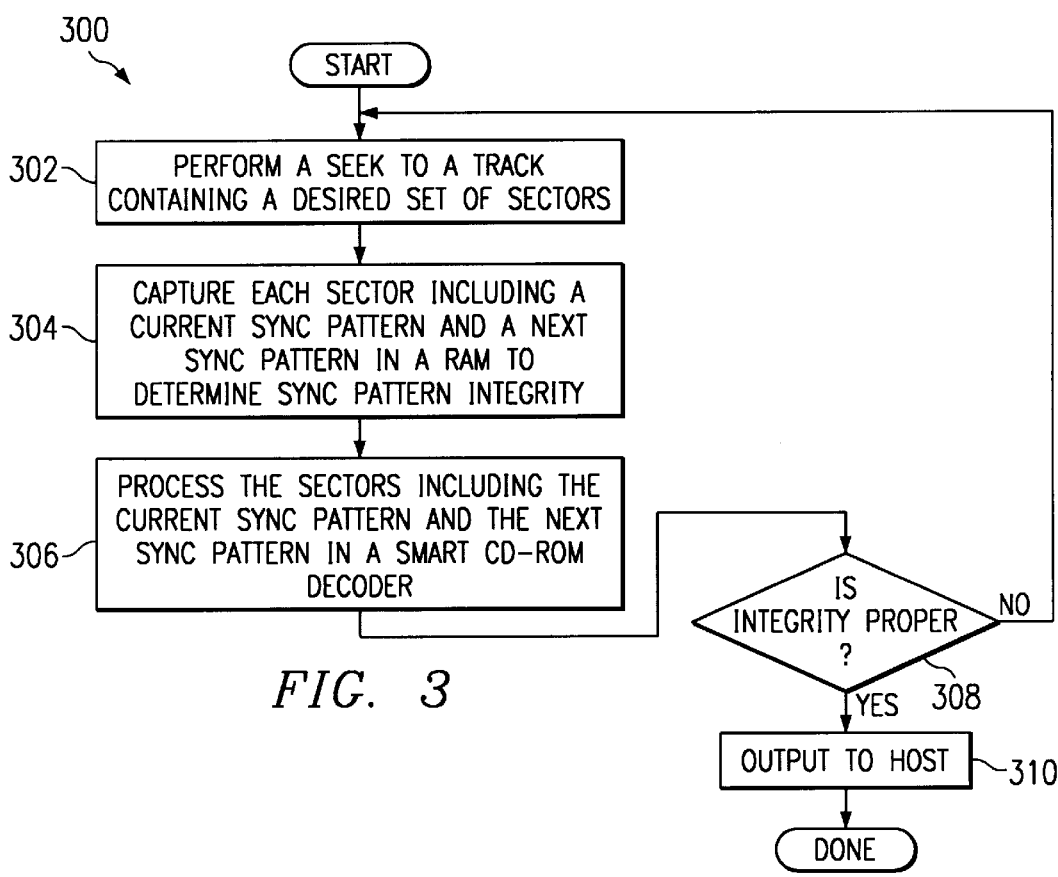
FIG. 3 shows a flowchart diagram that illustrates the method operations used in performing compact disc data integrity analysis in accordance with one embodiment of the present invention.

FIG. 3 shows a flowchart diagram 300 illustrating the method operations used in performing the CD data integrity analysis in accordance with one embodiment of the present invention. The method begins at an operation 302 where a seek to a track containing a desired set of sectors is performed. As is well known in the art, the seek will occur when the CD controller 214 initiates its search for the selected sectors that are read from the media. Once the seek to a track containing the desired set of sectors is performed in operation 302, the method will proceed to an operation 304.

In operation 304, each sector including a current sync pattern and a next sync pattern are captured and stored in a FIFO buffer in order to determine the sync pattern integrity. As previously illustrated in FIG. 2B, the FIFO buffer is implemented as the SRAM 226 that is in communication with the sync decoder state machine 216. Accordingly, the FIFO buffer will have at any given time, a sector of data including the sync pattern for that sector, and the sync pattern for the next sector. Of course, additional data may also be stored in the SRAM 226 for performing well known error correction operations. Once the capture has occurred in operation 304, the method will proceed to an operation 306 where the sectors, including the current sync pattern and the next sync pattern, are processed in the smart CD-ROM decoder 202 of FIG. 2B.

Next, the method will proceed to a decision operation 308 where it is determined whether the integrity of the sync pattern is proper. In general, the sync pattern will not be proper when the sync pattern is not identified or found where it is usually expected to reside (i.e., the sync pattern is missing). That is, two consecutive sync patterns are apart from each other by 2352 bytes. Accordingly, after a first sync pattern has been identified, the next sync pattern can be systematically checked for its presence at a distance of 2340 bytes apart from the first sync pattern in the FIFO buffer.

If the integrity is not proper, the method proceeds back to the operation 302 where a seek to the beginning of the track containing the desired set of sectors is again performed. After the seek to the track is complete, operations 304 and 306 are repeated to check for sync pattern integrity. Once the integrity of the current sync pattern and the next sync pattern is determined to be proper in decision operation 308, the header of the sector is checked to determine if the sector is the desired (i.e., target) sector. If the sector is the desired sector, the data in the sector is processed and output to the host 200 of FIG. 2A in an operation 310. The method then terminates.

FIG. 4 illustrates a state diagram 400 depicting changes in the states of the sync decoder state machine 216 as it processes a series of sector data received in the FIFO buffer (e.g., SRAM 226). The state diagram 400 initially begins at a default state 402 (i.e., state A). In default state 402, the sync decoder state machine 216 processes the data in the FIFO buffer to identify a current sync and a next sync. The sync decoder state machine 216 remains in default state 402 so long as the current sync pattern and the next sync pattern are both identified in the FIFO buffer. That is, both the current and the next sync pattern are of proper integrity. In this state 402, the sync decoder state machine 216 transfers the header associated with the current sync to the disk controller 208, which determines whether the sector associated with the transferred header is the desired (i.e., target) sector containing desired data.

However, when a next sync pattern is not identified in the FIFO buffer, the sync decoder state machine 216 proceeds to a state 404 (i.e., state B) and waits for the sector associated with the previously unidentified sync pattern and a new next sync pattern in the FIFO buffer. That is, the previously unidentified next sync pattern is labeled as a new current sync and the following sync pattern in the track is labeled as the new next sync pattern in the FIFO buffer. In between these sync patterns is stored the sector data that is associated with the new current sync. These changes in the FIFO buffer can be readily accomplished since the sizes of a sync pattern (i.e., 12 bytes) and sector are known. For example, the FIFO buffer can be partitioned (logically or physically) in the order of a current sync area of 12 bytes for holding a current sync pattern, a sector area of 2340 bytes for holding the data in the sector associated with the current sync pattern, and a next sync area of 12 bytes for storing the next sync pattern.

In state 404, if the new next sync is identified as a sync pattern, the sync decoder state machine 216 reverts back to state 402. In state 402, the sync decoder state machine 216 accepts the previously unidentified sync as a valid sync pattern by transferring the data in the header field associated with the accepted sync. In this manner, the sync decoder state machine 216 corrects for an unidentified sync pattern.

On the other hand, if the new next sync is not identified as a sync pattern in state 404, then the sync decoder state machine 216 proceeds to a state 406 (state C). In this case, no sync pattern has been identified in the FIFO buffer. When at state 406, the state machine 216 performs a search to identify a sync pattern between the current sync area and the next sync area in the FIFO buffer. In particular, the search determines whether a sync pattern has been early or late within the current sector area due, for example, to packet writing in CD-R media. In accordance with one embodiment of the present invention, the state machine 216 may include a sub-state machine for performing the search between the current sync area and the next sync area.

In state 406, when a sync pattern is not identified in the FIFO buffer between the current sync and the next sync areas, the sync decoder state machine 216 progresses to a state 410 (state E). In state 410, the state machine 216 determines that a fatal error has occurred and restarts the sync search from the beginning of a track where the search originally started by proceeding to state 402.

On the other hand in state 406, when a sync pattern (i.e., middle sync pattern) is identified between the current sync area and the next sync area, the state machine 216 moves to a state 408 (state D) and labels the newly identified sync pattern to the current sync area in the FIFO buffer (i.e., and becomes the current sync pattern). Further, the sync decoder state machine 216 stores the remaining portions of the sector associated with the newly identified sync pattern to the current sector area of the FIFO buffer. In addition, the state machine 216 determines the next sync that is 2340 bytes apart from the newly identified sync pattern, and stores the next sync into the next sync area of the FIFO buffer.

After detecting the new sync pattern in the current sector area in state 406, the sync decoder state machine 216, in state 408, identifies the next sync pattern in the next sync area to confirm the integrity or validity of the detected current sync pattern. If the next sync pattern is identified in next sync area of the FIFO buffer, the state machine 216 proceeds back to state 402. In state 402 as described above, the sync decoder state machine 216 accepts the shifted current sync as a valid sync pattern by transferring the data in the header field associated with the accepted sync. The new shifted current sync pattern serves as a reference sync for the following syncs, thereby ensuring detection of shifted sync patterns, which are created, for example, through packet writing. In this manner, the sync decoder state machine 216 identifies sync patterns written early or late within a sector.

However in state 408, when a next sync pattern is not found in the next sync area in the FIFO buffer, the sync decoder state machine 216 proceeds to state 410 (state E). In state 410, the state machine 216 determines that a fatal error has occurred and restarts the sync search from the beginning of a track where the search originally started by progressing to state 402. The functionality of the sync decoder state machine 216 will now be described in greater detail with reference to several exemplary data sectors and respective sync patterns.

FIGS. 5A through 5D illustrate the states of the sync decoder state machine 216 as a series of sectors are read from a CD-ROM medium into the FIFO buffer for identifying the sync patterns. For illustration purposes, the FIFO buffer is superimposed over the series of data read from the CD-ROM medium to illustrate a series of FIFO buffer frames F1 through F11 to more clearly illustrate the changes in the content of the FIFO buffer. The state machine 216 identifies the sync patterns by loading a block of data into the FIFO buffer. The letters A, B, C, D, and E denoted in the FIFO buffer frames F1 through F11 correspond to states 402, 404, 406, 408, and 410, respectively, of FIG. 4. Preferably, state transitions occur at the boundary of the FIFO buffer frames.

Referring still to FIGS. 5A through 5D, each of the FIFO buffer frames F1 through F11 contains a current sync area and a next sync area for storing a current sync pattern and a next sync pattern, respectively. The sync area in the FIFO buffer may contain a proper sync pattern indicated as a solid vertical strip and/or an improper sync pattern represented as a dotted vertical strip. The proper sync pattern refers to an identifiable sync pattern or a sync pattern of proper integrity. On the other hand, an improper sync pattern refers to a corrupted, contaminated, unidentifiable, or altogether missing sync pattern. A proper sync pattern may also be present between the current sync area and the next sync area. Arrow 500 indicates the direction in time of reading or loading the sequence of sync and sector data into the FIFO buffer to form frames F1 through F11.

Figure 5A:
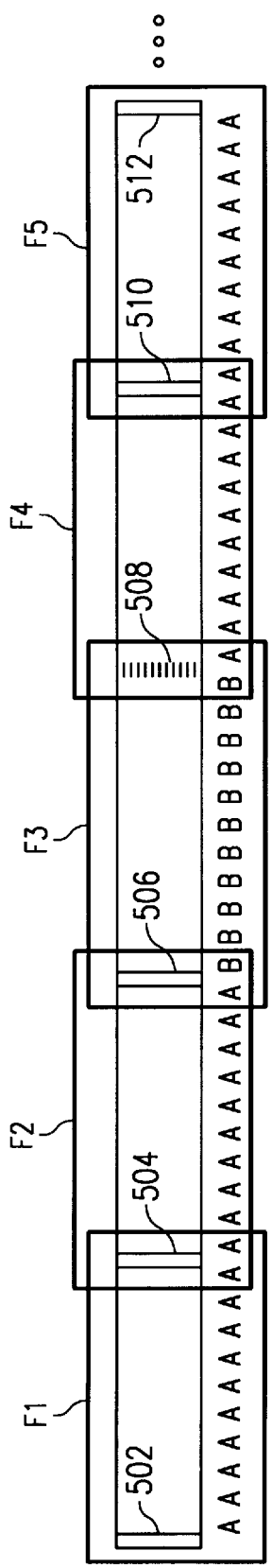
FIGS. 5A through 5D illustrate state changes that are performed by the sync decoder state machine as sectors are read from a CD-ROM medium.

FIG. 5A illustrates detection and correction of an unidentifiable sync that is read into the FIFO buffer frame F3. Initially, the sync decoder state machine 216, in default state A, loads a current sync pattern 502, a next sync pattern 504, and the sector data in between into the sector data area of the FIFO buffer indicated as frame F1. Since both sync patterns are of proper integrity, the state machine 216 accurately detects the current sync pattern and the next sync pattern.

Then, the sync decoder state machine 216 loads the next sync pattern 504 into the current sync area, the new next sync pattern 506 into the next sync area, and the sector data in between into the sector data area of the FIFO buffer indicated as frame F2. Since both sync patterns 504 and 506 are proper, the sync decoder state machine 216 also correctly detects the sync patterns 504 and 506. Hence, the state machine 216 continues in the default state A.

The state machine 216 then loads the next sync pattern 506 of frame F2 into the current sync area, a new next sync pattern 508 into the next sync area, and the sector data in between into the sector data area of the FIFO buffer indicated as frame F3. In this case, the next sync pattern 508 of frame F3 is not of proper integrity due to corruption, noise, etc. Since the next sync pattern 508 in frame F3 is not proper, the sync decoder state machine 216 will not detect a sync pattern in the next sync area of frame F3 and proceeds to state B.

The state machine 216 reads in the improper next sync pattern 508 into the current sync area, the new next sync pattern 510 into the next sync area, and the sector data in between into the sector data area of the FIFO buffer indicated as frame F4. At this point, the state machine 216 will ascertain that the new next sync pattern is proper and reverts back to state A. Hence, the state machine 216 confirms that the current improper sync pattern 508 is a valid sync pattern and triggers the transfer of a header associated with the current sync pattern 508. Thereafter, the state machine 216 continues the sync pattern detection operation by reading in the next sync pattern 510 into the current sync area, the new next sync pattern 510 into the next sync area, and the sector data in between into the sector data area of the FIFO buffer indicated as frame F5. Since both sync patterns are proper, the state machine continues in state A.

Figure 5B:
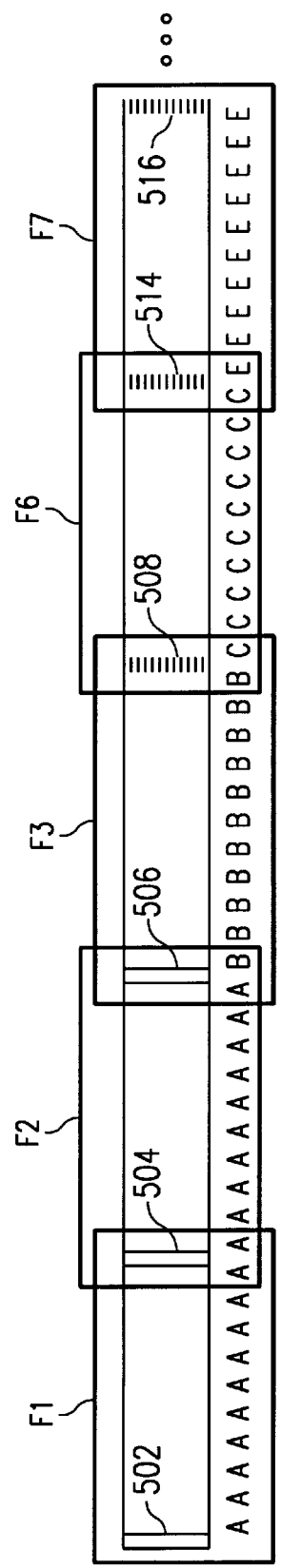

FIG. 5B illustrates changes in the state of the sync decoder state machine 216 when both the current sync pattern and the next sync pattern are not detected. The first three FIFO buffer frames F1, F2, and F3 are the same as in FIG. 5A and operate in similar manner as described above. After the frame F3, the sync decoder state machine 216 proceeds to load the improper next sync pattern 508 into the current sync area, the sector data associated with the sync pattern 508 into the sector area, and an improper sync pattern 514 into the next sync area of the FIFO buffer indicated as frame F6. It should be appreciated that the sync pattern 508 may be completely missing in its entirety or improper due to contamination, noise, corruption, etc.

Due to the improper integrity, the state machine 216 is not able to identify the improper sync pattern 514 as a sync pattern and proceeds to state C. In state C, the state machine 216 searches for a sync pattern in the area between the current sync area and the next sync area of frame F6. Upon finding no sync pattern in between, the sync decoder state machine 216 proceeds to state E. In state E, the state machine 216 triggers a fatal error, which restarts the search process from the beginning.

Figure 5C:
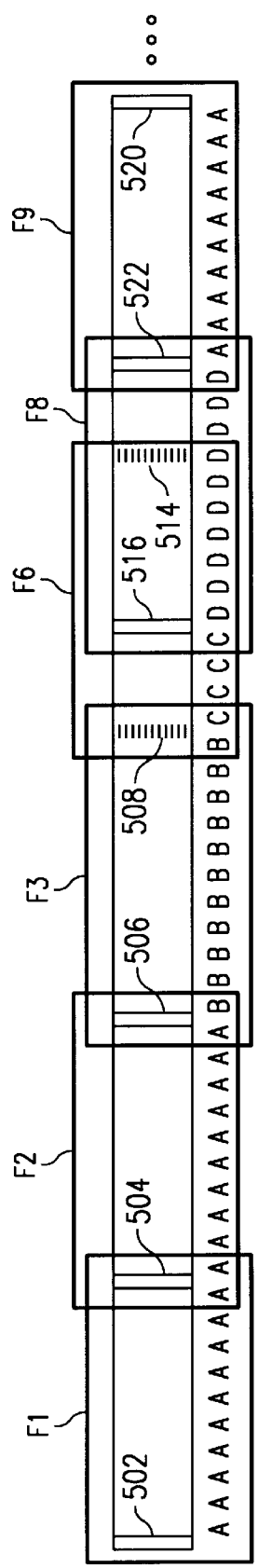

FIG. 5C illustrates changes in the state of the sync decoder state machine 216 when both the current sync pattern and the next sync pattern are missing, but a sync pattern is found between the two improper sync patterns in the FIFO buffer. The first four FIFO buffer frames F1, F2, F3, and F4 are the same frames as in FIGS. 5A and 5B and operate in similar manner as described above.

In FIG. 5C however, the state machine 216 identifies an out of phase or shifted sync pattern 516 in the area between the current sync area and the next sync area of frame F6 and enters state D. Upon identifying the shifted sync pattern 516, the state machine 216 proceeds to load the identified sync pattern into the current sync area, and a sync pattern 522 into the next sync area of the FIFO buffer indicated as frame F8. The state machine 216 detects the next sync pattern 522 as being proper and thus confirms the validity of the current sync pattern 516. At this point, the state machine 216 progresses to state A to transfer header information associated with the current sync pattern 516.

Figure 5D:
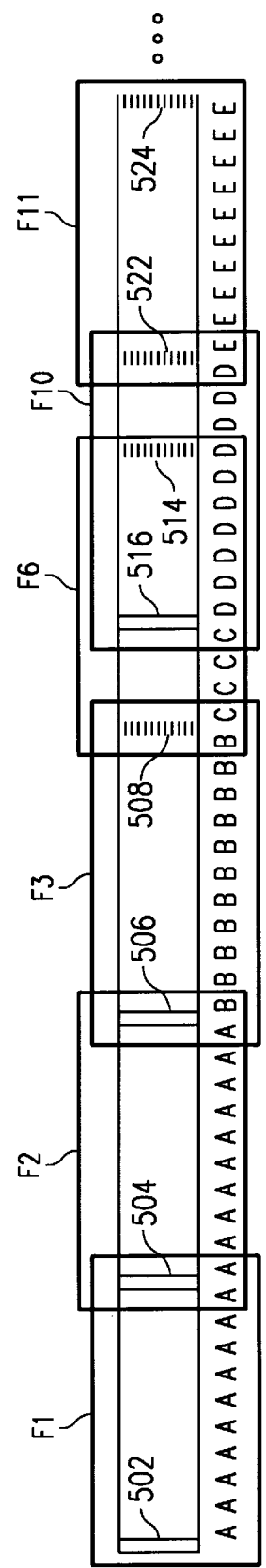

On the other hand, FIG. 5D illustrates a situation where a next sync 522 after the shifted current sync 516 is not identified. In this case, the sync decoder state machine 216 proceeds into state E, which triggers a fatal error. The state machine 216 then restarts the sync search process from the beginning of the original track.

The present invention thus provides advantages over prior art techniques, which typically ignored or tolerated a few missing or unidentified sync patterns without restarting the search for the desired sector. For example, when a sync pattern is not identified due to corruption or noise, the present invention allows validation of the unidentified sync pattern by identifying the presence of the next sync pattern. The detection of the next sync pattern thus confirms that the previous unidentified sync pattern has been misread due to corruption, noise, etc. In this manner, the present invention corrects for the unidentified sync pattern and continues with normal operation without restarting the search from the beginning of a track.

In addition, by using a hard wired state machine to automatically detect and examine sync patterns on-the-fly, the present invention provides significant performance advantages over the prior art, which typically ignored or tolerated unidentified syncs through software. Furthermore, the present invention also significantly improves the reading performance in reading CD-R media that are recorded using the packet writing technique. Although the embodiments of the present invention are particularly advantageous for CD-ROM media, other media may include audio CDs, CD-R (Recordable) discs, video CDs, photo CDs, CD-I (Interactive), etc.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention. By way of example, a VHDL® hardware description language available from IEEE of New York, N.Y. may be used to design an appropriate silicon-level layout. Although any suitable design tool may be used, another layout tool may include a hardware description language "Verilog®" tool available from Cadence Design Systems, Inc. of Santa Clara, Calif.

The invention may employ various computer-implemented operations involving data stored in computer systems to drive computer peripheral devices (i.e., in the form of software drivers). These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A peripheral device having internal circuitry for controlling and processing data that is read from a medium of the peripheral device, comprising:

a digital signal process that is configured to receive data that is being read from the medium of the peripheral device;

a decoder circuit being coupled to the digital signal processor and comprising part of the internal circuitry, the decoder including an internal RAM that is configured to store a sector of the data including a current sync patterns and a next sync pattern; and the decoder circuit further including a state machine receiving as input the current sync pattern and a next sync pattern of the sector of the data, and being configured to determine whether a fatal error is present in the data.

2. A peripheral device as recited in claim 1, wherein the fatal error is present when the current sync pattern and the next sync pattern are not identified and a middle sync pattern between the current sync pattern and the next sync pattern is not identified.

3. A peripheral device as recited in claim 2, wherein when the current sync pattern and the next sync pattern are not identified by the state machine, and a middle sync pattern between the current sync pattern and the next sync pattern is identified, the middle sync pattern becomes a shifted current sync pattern.

4. A peripheral device as recited in claim 3, wherein the internal RAM holds the shifted current sync pattern and a shifted next sync pattern, including a data sector between the shifted current sync pattern and the shifted next sync pattern.

5. A peripheral device as recited in claim 1, wherein when the next sync pattern is not identified, the internal RAM is provided with a next sequential sector of the data, and the next sync pattern becomes a new current sync pattern and a following sync pattern that lies after the next sync pattern becomes a new next sync pattern.

6. A peripheral device as recited in claim 5, wherein when the new next sync pattern is identified, the state machine determines that no fatal error has occurred.

7. A peripheral device as recited in claim 5, wherein when the new next sync pattern is not identified, the state machine determines that a fatal error has occurred.

8. A peripheral device as recited in claim 1, wherein the internal RAM is sequentially updated with a new sector that includes an associated current sync pattern and an associated next sync pattern.

9. A method for detecting sync patterns from data that is read from a CD-ROM medium, comprising:

receiving the data that is being read from the CD-ROM medium;

storing a sector of the data including a current sync pattern and a next sync pattern; and analyzing the current sync pattern and the next sync pattern of the sector of the data to determine whether a fatal error is present in the data.

10. A method as recited in claim 9, wherein the fatal error is present when the current sync pattern and the next sync pattern are not identified and the analyzing determines that a middle sync pattern between the current sync pattern and the next sync pattern is not identified.

11. A method as recited in claim 10, wherein when the current sync pattern and the next sync pattern are not identified, and a middle sync pattern between the current sync pattern and the next sync pattern is identified, the middle sync pattern becomes a shifted current sync pattern.

12. A method as recited in claim 11, wherein the shifted current sync pattern and a shifted next sync pattern includes a data sector between the shifted current sync pattern and the shifted next sync pattern.

13. A method as recited in claim 12, wherein the shifted current sync pattern and a shifted next sync pattern are stored for analyzing.

14. A method as recited in claim 9, wherein when the next sync pattern is not identified, designating the next sync pattern as a new current sync pattern and a following sync pattern that lies after the next sync pattern as a new next sync pattern.

15. A method as recited in claim 14, wherein a fatal error does not occur when the new next sync pattern is identified.

16. A method as recited in claim 14, wherein a fatal error occurs when the new next sync pattern is not identified.

17. A peripheral device as recited in claim 9, wherein a new sector is sequentially received and stored for analyzing, the new sector including an associated current sync pattern and an associated next sync pattern.

18. A device for detecting synchronizing patterns from data that are read from a CD-ROM media, comprising:

means for sequentially receiving the data that are read from the CD-ROM media for processing;

means for storing the sequentially received data in a first-in-first-out (FIFO) buffer that is large enough to store a current sync pattern, a sector associated with the current sync pattern, and a next sync pattern, wherein the data are sequentially stored in the FIFO buffer in a first-in and first-out manner such that the next sync pattern becomes the current sync pattern and a new next sync pattern becomes the next sync pattern; and means for detecting the integrity of the sync patterns of the data in the FIFO buffer wherein the detecting means generates a fatal error when no sync pattern is identified in the FIFO buffer.

19. The device as recited in claim 18 wherein the fatal error triggers a new search for sync patterns.

20. The device as recited in claim 19, wherein when the current sync pattern and the next sync pattern are not identified, and a middle sync pattern between the current sync pattern and the next sync pattern is identified, the middle sync pattern becomes a shifted current sync pattern such that the FIFO buffer begin storing data from the shifted current sync pattern.

21. The device as recited in claim 20, wherein the shifted current sync pattern and a shifted next sync pattern are stored for analyzing.

22. The device as recited in claim 19, wherein a new sector is sequentially received and stored for analyzing, the new sector including an associated current sync pattern and a contiguous next sync pattern.

23. The device as recited in claim 19, wherein when a next sync is not identified, the identification of a new next sync confirms the integrity of the previously unidentified next sync.

24. The device as recited in claim 18 wherein the detecting means generates the fatal error when the current sync pattern and the next sync pattern are not identified and no sync pattern is identified between the current sync pattern and the next sync pattern.

25. The device as recited in claim 18, wherein when the next sync pattern is not identified, designating the next sync pattern as a new current sync pattern and a following sync pattern that lies after the next sync pattern as a new next sync pattern.

26. The device as recited in claim 25, wherein a fatal error does not occur when the new next sync pattern is identified.

27. The device as recited in claim 25, wherein a fatal error occurs when the new next sync pattern is not identified.

* * * * *